US008587273B2

(12) United States Patent
Chen et al.

(10) Patent No.: US 8,587,273 B2
(45) Date of Patent: Nov. 19, 2013

(54) VOLTAGE GENERATOR HAVING PULL-UP CIRCUIT AND PULL-DOWN CIRCUIT

(75) Inventors: Chih-Jen Chen, Kaohsiung (TW); Kuang-Wei Chao, Taoyuan County (TW)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 168 days.

(21) Appl. No.: 13/208,344

(22) Filed: Aug. 12, 2011

(65) Prior Publication Data

US 2013/0038315 A1 Feb. 14, 2013

(51) Int. Cl.
*G05F 1/00* (2006.01)
(52) U.S. Cl.
USPC .......................... 323/273; 323/270
(58) Field of Classification Search
USPC ................................. 323/270–275
See application file for complete search history.

(56) References Cited

U.S. PATENT DOCUMENTS

| 2006/0261788 | A1* | 11/2006 | May | 323/273 |
| 2007/0222487 | A1* | 9/2007 | Jin | 327/143 |
| 2008/0054866 | A1* | 3/2008 | Korsunsky | 323/272 |
| 2008/0111533 | A1* | 5/2008 | Kang | 323/318 |
| 2008/0122478 | A1* | 5/2008 | Mei | 326/27 |

* cited by examiner

*Primary Examiner* — Timothy J Dole
*Assistant Examiner* — Yusef Ahmed
(74) *Attorney, Agent, or Firm* — Winston Hsu; Scott Margo

(57) ABSTRACT

A voltage generator includes a controllable voltage divider, a pull-up circuit and a first pull-down circuit. The controllable voltage divider is utilized for generating an output voltage at an output node of the controllable voltage divider according to a first reference voltage, a second reference voltage, and a control signal, wherein the second reference voltage is lower than the first reference voltage. The pull-up circuit is coupled to the output node of the controllable voltage divider and the first reference voltage, and is utilized for selectively connecting the first reference voltage to the output node of the controllable voltage divider. The first pull-down circuit is coupled to the output node of the controllable voltage divider and the second reference voltage, and is utilized for selectively connecting the second reference voltage to the output node of the controllable voltage divider.

5 Claims, 4 Drawing Sheets

VOLTAGE GENERATOR HAVING PULL-UP CIRCUIT AND PULL-DOWN CIRCUIT

BACKGROUND OF THE INVENTION

1. Field of the Invention

The present invention relates to a voltage generator, and more particularly, to a DC voltage generator which has a fast response time.

2. Description of the Prior Art

In a dynamic random access memory (DRAM) which adopts a double data rate DDR4 standard, an internal DC voltage generator is used by a DQ receiver to determine a received signal to be a logic value "0" or "1". Please refer to FIG. 1, which is a diagram illustrating a conventional DC voltage generator 100. As shown in FIG. 1, the conventional DC voltage generator 100 includes a controllable voltage divider 110, a regulator 120 and capacitors C1 and C2, where the controllable voltage divider 110 includes a variable resistor R1 and a resistor R2, and the regulator 120 includes a power amplifier 122, a transistor M1 and two resistors R3 and R4.

In the operations of the conventional DC voltage generator 100, a voltage level of a regulated voltage $V_{REFD}$ of the conventional DC voltage generator 100 is controlled by a control signal MRS. When the control signal MRS instructs the conventional DC voltage generator 100 to increase/decrease the output voltage $V_{REFD}$, the output voltage $V_{REFD}$ may require a long period of time to achieve the required voltage level; in other words, the response time is slow. To improve the response time, one solution reduces the capacitance of the capacitors C1 and C2, but the power supply rejection ratio (PSRR) and stability of the conventional DC voltage generator 100 will be worsened.

SUMMARY OF THE INVENTION

It is therefore an objective of the present invention to provide a DC voltage generator that can improve the response time without causing the above-mentioned side effects, in order to solve the problems associated with the conventional art.

According to one embodiment of the present invention, a voltage generator includes a controllable voltage divider, a pull-up circuit and a first pull-down circuit. The controllable voltage divider is utilized for generating an output voltage at an output node of the controllable voltage divider according to a first reference voltage, a second reference voltage, and a control signal, wherein the second reference voltage is lower than the first reference voltage. The pull-up circuit is coupled to the output node of the controllable voltage divider and the first reference voltage, and is utilized for selectively connecting the first reference voltage to the output node of the controllable voltage divider. The first pull-down circuit is coupled to the output node of the controllable voltage divider and the second reference voltage, and is utilized for selectively connecting the second reference voltage to the output node of the controllable voltage divider.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one skilled in the art will appreciate, manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." The terms "couple" and "couples" are intended to mean either an indirect or a direct electrical connection. Thus, if a first device couples to a second device, that connection may be through a direct electrical connection, or through an indirect electrical connection via other devices and connections.

Figure 1:
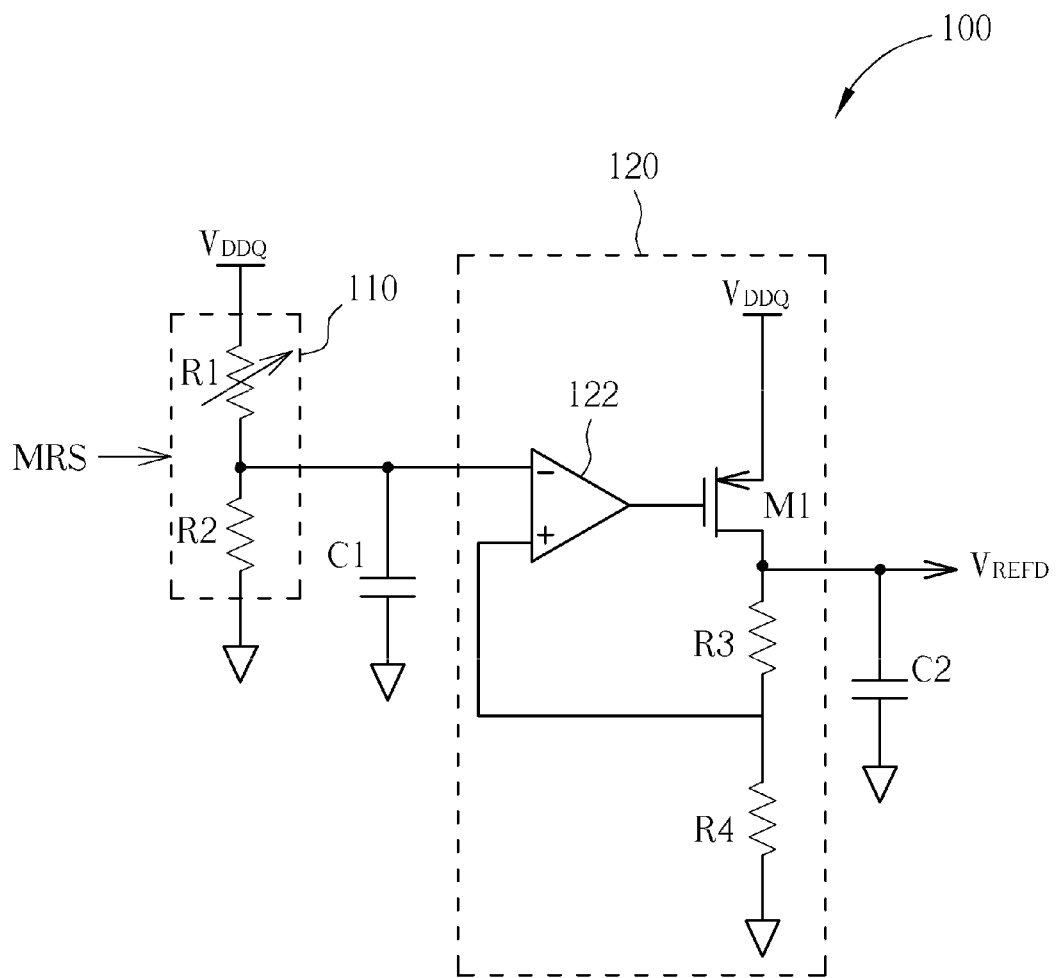
FIG. 1 is a diagram illustrating a conventional DC voltage generator.
Figure 2:
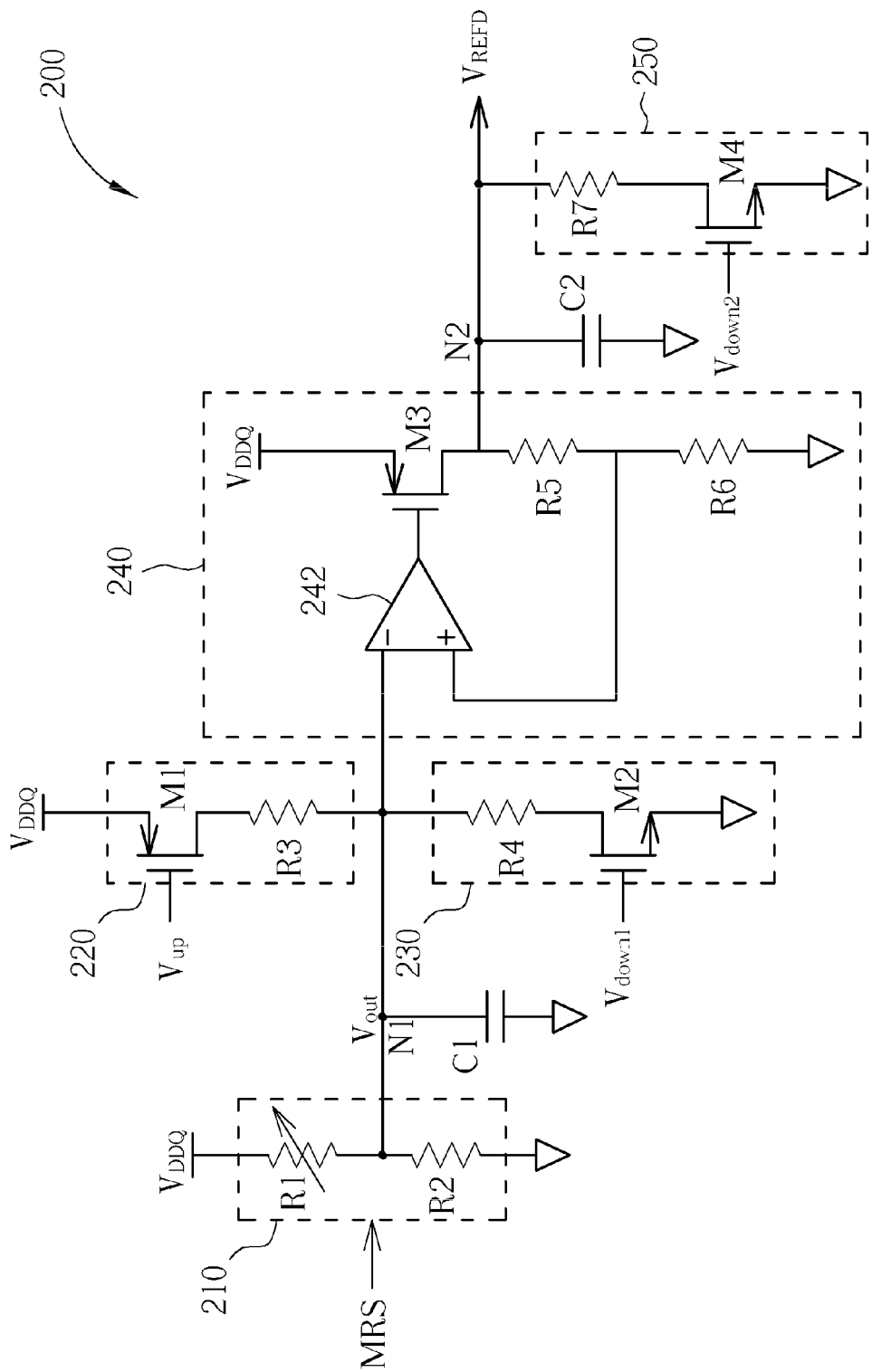
FIG. 2 is a diagram illustrating a DC voltage generator according to one embodiment of the present invention.

Please refer to FIG. 2, which is a diagram illustrating a DC voltage generator 200 according to one embodiment of the present invention. As shown in FIG. 2, the DC voltage generator 200 includes a controllable voltage divider 210, a pull-up circuit 220, a first pull-down circuit 230, a regulator 240 and a second pull-down circuit 250 and two capacitors C1 and C2, where: the controllable voltage divider 210 includes a variable resistor R1 and a resistor R2; the pull-up circuit 220 includes a transistor M1 and a resistor R3; the first pull-down circuit 230 includes a transistor M2 and a resistor R4; the regulator 240 includes a power amplifier 242, a transistor M3 and two resistors R5 and R6; and the second pull-down circuit 250 includes a transistor M4 and a resistor R7. In addition, in this embodiment, the DC voltage generator 200 is applied to a dynamic random access memory (DRAM).

In the operations of the DC voltage generator 200, the controllable voltage divider 210 receives a control signal MRS and generates an output voltage $V_{out}$ at an output node N1 of the controllable voltage divider 210 according to a supply voltage $V_{DDQ}$, a ground voltage and the control signal MRS, where the control signal MRS is used to control a voltage level of the output voltage $V_{out}$. Then, the regulator 240 receives the output voltage $V_{out}$ from the output node N1 of the controllable voltage divider 210 and generates a regulated voltage $V_{REFD}$ at an output node N2 of the regulator 240. It is noted that, because the operations of the regulator 240 are known by a person skilled in this art, further descriptions are omitted here. In addition, in one embodiment, the regulated voltage $V_{REFD}$ is used for a DQ receiver within the DRAM to determine a received signal to be a logic value "0" or "1".

When the control signal MRS instructs the controllable voltage divider 210 to increase the output voltage $V_{out}$, the transistor M1 of pull-up circuit 220 is immediately enabled by a control signal $V_{up}$ to connect the supply voltage $V_{DDQ}$ to the output node N1 of the controllable voltage divider 210, the transistor M2 of the first pull-down circuit 230 is disabled by a control signal $V_{down1}$ to make the ground voltage disconnect from the output node N1 of the controllable voltage divider 210, and the transistor M4 of the second pull-down circuit 250 is disabled by a control signal $V_{down2}$ to make the ground voltage disconnect from the output node N2 of the regulator 240. In one embodiment, the enabling period of the pull-up circuit 220 is about 10 ns.

Because the pull-up circuit 220 connects the supply voltage $V_{DDQ}$ to the output node N1 of the controllable voltage divider when the control signal MRS instructs the controllable voltage divider 210 to increase the output voltage $V_{out}$, the output voltage $V_{out}$ and the regulated voltage $V_{REFD}$ can achieve the required voltage level faster (i.e. the response time is shortened) without causing side effects such as PSRR and stability issues.

Figure 3:
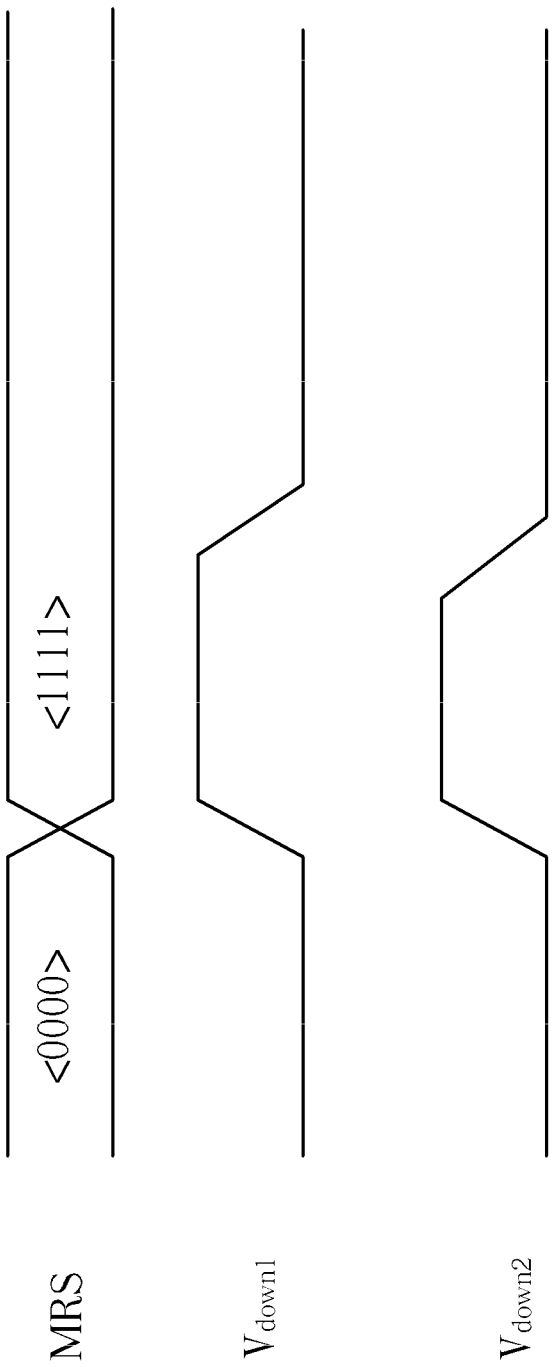
FIG. 3 shows the enabling periods of a first pull-down circuit and a second pull-down circuit according to an embodiment of the present invention.

In addition, when the control signal MRS instructs the controllable voltage divider 210 to decrease the output voltage $V_{out}$, the transistor M2 of the first pull-down circuit is immediately enabled by the control signal $V_{down1}$ to connect the ground voltage to the output node N1 of the controllable voltage divider 210, the transistor M4 of the second pull-down circuit 250 is immediately enabled by the control signal $V_{down2}$ to connect the ground voltage to the output node N2 of the regulator 240, and the transistor M1 of pull-up circuit 220 is disabled by the control signal $V_{up}$ to make the supply voltage $V_{DDQ}$ disconnect from the output node N1 of the controllable voltage divider 210. Please refer to FIG. 3 which illustrates one embodiment where the first pull-down circuit 230 and the second pull-down circuit 250 are enabled simultaneously, and an enabling period of the first pull-down circuit 230 is greater than an enabling period of the second pull-down circuit 250.

Because the first pull-down circuit 230 connects the ground voltage to the output node N1 of the controllable voltage divider 210, and the second pull-down circuit 250 connects the ground voltage to the output node N2 of the regulator 240 when the control signal MRS instructs the controllable voltage divider 210 to decrease the output voltage $V_{out}$, the output voltage $V_{out}$ and the regulated voltage $V_{REFD}$ can achieve the required voltage level faster (i.e. the response time is shortened) without causing side effects such as PSRR and stability issues.

Figure 4:
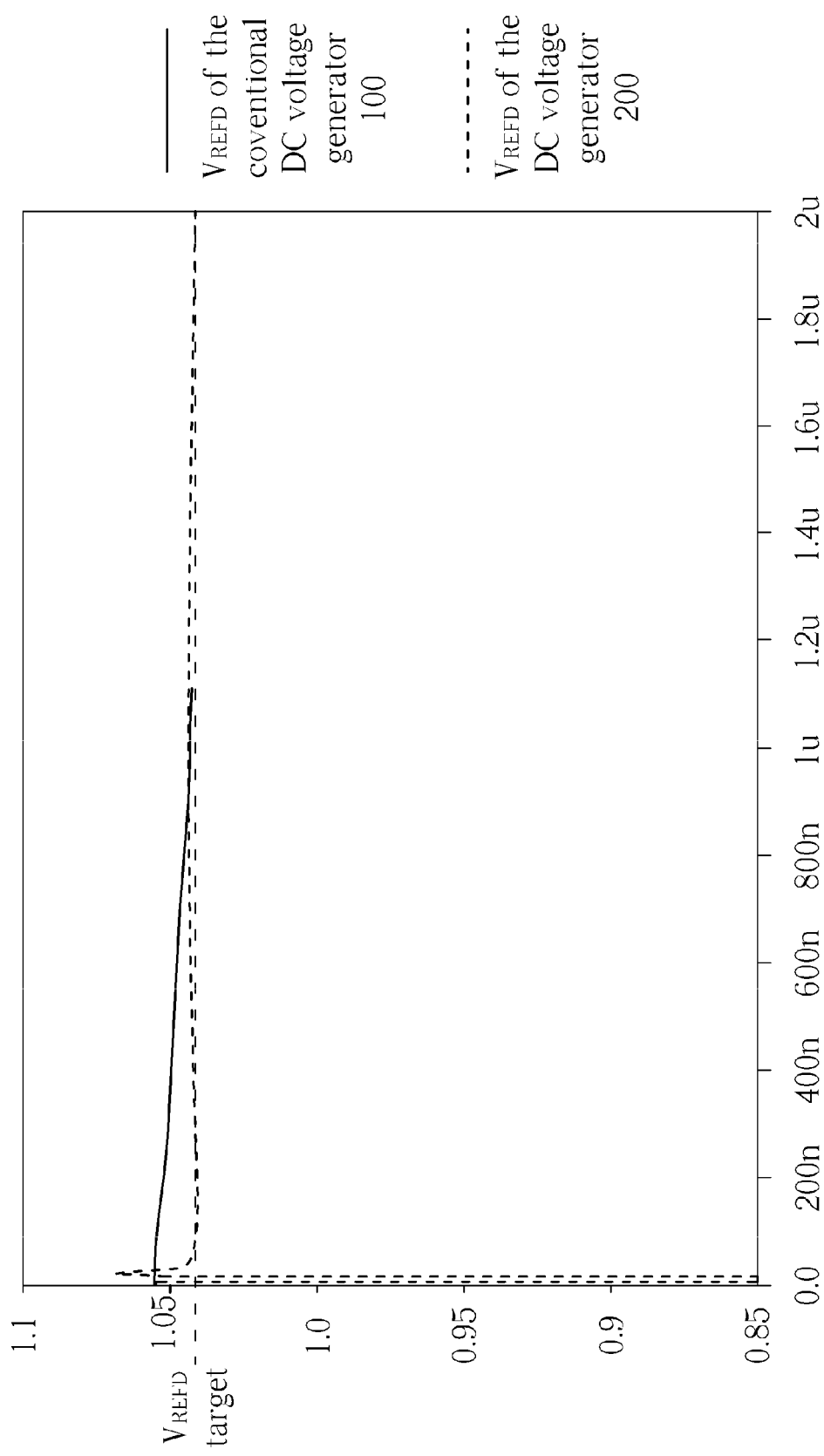
FIG. 4 is a diagram showing a simulation of regulated voltages of the DC voltage generator shown in FIG. 2 and the conventional DC voltage generator shown in FIG. 1.

FIG. 4 is a diagram showing a simulation of regulated voltages $V_{REFD}$ of the DC voltage generator 200 and the conventional DC voltage generator 100. As shown in FIG. 4, the DC voltage generator 200 can achieve the target level much faster than the conventional DC voltage generator 100.

The detailed circuit structure of the DC voltage generator 200 shown in FIG. 2 is for illustrative purposes only, and should not be construed as a limitation of the present invention. As long as the functions are substantially the same, the detailed circuit structures of the pull-up circuit 220, the first pull-down circuit 230, the second pull-down circuit 250 and the regulator 240 can be implemented by other circuit structures. For example, in other embodiments, the resistors R3 within the pull-up circuit 220, the resistors R4 within the first pull-down circuit 230, and the resistors R7 within the second pull-down circuit 250 can be removed from the DC voltage generator 200 without influencing the normal operations.

In addition, the regulator 240 and the second pull-down circuit 250 are optional devices. In another embodiment of the present invention, the regulator 240 and the second pull-down circuit 250 can be removed from the DC voltage generator 200, and the output voltage $V_{out}$ of the controllable voltage divider 210 is used for a DQ receiver within the DRAM to determine a received signal to be a logic value "0" or "1".

Briefly summarized, in the DC voltage generator of the present invention, a pull-up circuit and at least a pull-down circuit are applied to shorten the response time of the DC voltage generator. Therefore, the output of the DC voltage generator can achieve the required voltage level faster without causing side effects such as PSRR and stability issues.

Those skilled in the art will readily observe that numerous modifications and alterations of the device and method may be made while retaining the teachings of the invention.

What is claimed is:

1. A voltage generator, comprising:
   a controllable voltage divider, for generating an output voltage at an output node of the controllable voltage divider according to a first reference voltage, a second reference voltage, and a control signal, wherein the second reference voltage is lower than the first reference voltage, and a voltage level of the output voltage is adjusted according to the control signal;
   a pull-up circuit, coupled to the output node of the controllable voltage divider and the first reference voltage, for selectively electrically connecting the first reference voltage to the output node of the controllable voltage divider;
   a first pull-down circuit, coupled to the output node of the controllable voltage divider and the second reference voltage, for selectively electrically connecting the second reference voltage to the output node of the controllable voltage divider;
   a regulator, coupled to the output node of the controllable voltage divider, for receiving the output voltage from the output node of the controllable voltage divider and generating a regulated voltage at an output node of the regulator; and
   a second pull-down circuit, coupled to the output node of the regulator and the second reference voltage, for selectively electrically connecting the second reference voltage to the output node of the regulator;
   wherein when the control signal instructs the controllable voltage divider to decrease the output voltage at the output node of the controllable voltage divider, the first pull-down circuit is enabled to electrically connect the second reference voltage to the output node of the controllable voltage divider, the second pull-down circuit is enabled to electrically connect the second reference voltage to the output node of the regulator, and the pull-up circuit does not electrically connect the first reference voltage to the output node of the controllable voltage divider;
   wherein when the control signal instructs the controllable voltage divider to decrease the output voltage at the output node of the controllable voltage divider the first pull-down circuit and the second pull-down circuit are enabled simultaneously, and an enabling period of the first pull-down circuit is greater than an enabling period of the second pull-down circuit.

2. The voltage generator of claim 1, wherein when the control signal instructs the controllable voltage divider to increase the output voltage at the output node of the controllable voltage divider, the pull-up circuit is enabled to electrically connect the first reference voltage to the output node of the controllable voltage divider, and the first pull-down circuit does not electrically connect the second reference voltage to the output node of the controllable voltage divider.

3. The voltage generator of claim 1, wherein when the control signal instructs the controllable voltage divider to decrease the output voltage at the output node of the controllable voltage divider, the first pull-down circuit is enabled to electrically connect the second reference voltage to the output node of the controllable voltage divider, and the pull-up circuit does not electrically connect the first reference voltage to the output node of the controllable voltage divider.

4. The voltage generator of claim 1, wherein when the control signal instructs the controllable voltage divider to increase the output voltage at the output node of the controllable voltage divider, the pull-up circuit is enabled to electrically connect the first reference voltage to the output node of the controllable voltage divider, the first pull-down circuit does not electrically connect the second reference voltage to the output node of the controllable voltage divider, and the second pull-down circuit does not electrically connect the second reference voltage to the output node of the regulator.

5. The voltage generator of claim 1, applied to a dynamic random access memory (DRAM).

* * * * *